United States Patent [19]

Kandybowski

[11] Patent Number: 4,601,525

[45] Date of Patent: Jul. 22, 1986

[54] COVER FOR CHIP CARRIER SOCKETS

[75] Inventor: Steven J. Kandybowski, Tower City, Pa.

[73] Assignee: AMP Incorporated, Harrisburg, Pa.

[21] Appl. No.: 735,505

[22] Filed: May 20, 1985

[51] Int. Cl.⁴ .............................................. H01R 9/09
[52] U.S. Cl. ........................... 339/75 MP; 339/17 CF
[58] Field of Search ........... 339/17 CF, 75 M, 75 MP

[56] References Cited

U.S. PATENT DOCUMENTS 4,460,223  7/1984  Brown et al. ................... 339/17 CF
4,504,105  3/1985  Barkus et al. ................... 339/17 CF Primary Examiner—John McQuade
Attorney, Agent, or Firm—Allan B. Osborne

[57] ABSTRACT

A cover for a chip carrier socket having integral release means. The cover includes depending sections with lips on the free end to catch under downwardly facing shoulders on the socket. Lever arms on the depending sections are depressible to pivot the lips out from beneath the shoulders.

9 Claims, 5 Drawing Figures

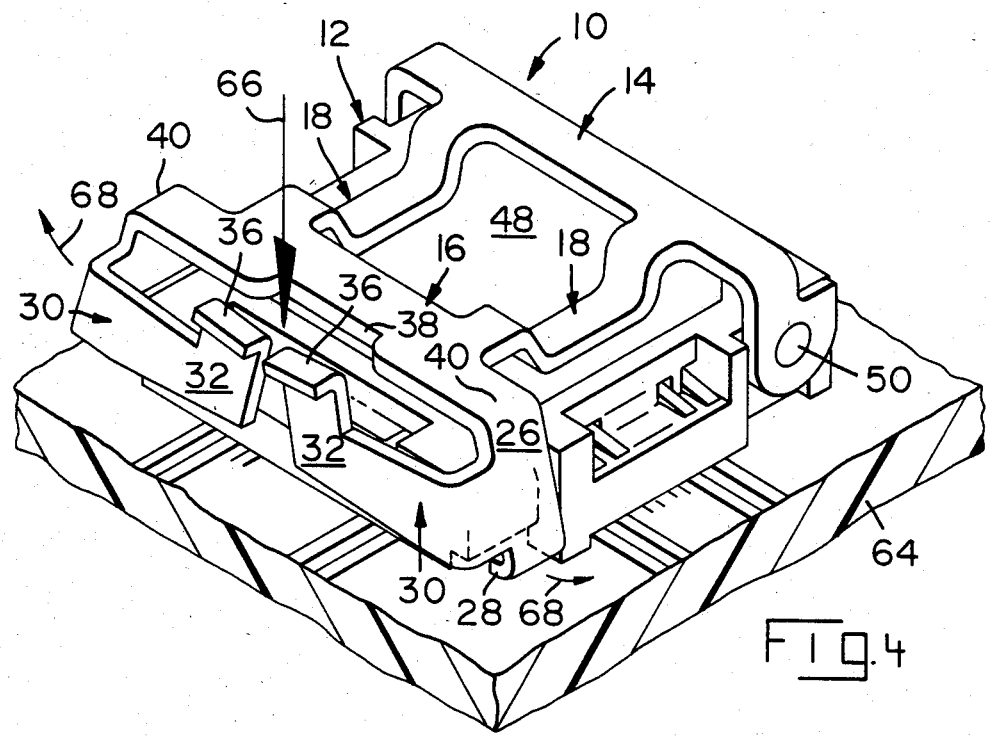
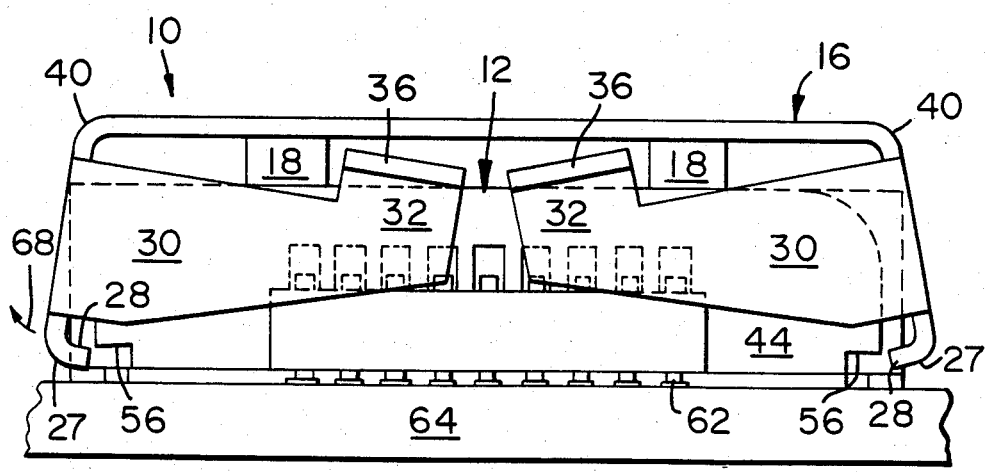

COVER FOR CHIP CARRIER SOCKETS

There is described in U.S. Pat. No. 4,427,249 a removable cover for a leadless chip carrier socket. The cover includes latches having depending members at each corner with an inwardly projecting lip at the free ends. The lips catch beneath downwardly facing shoulders on the socket to secure the cover thereon. Further included are laterally extending tabs on each latch which, in cooperation with a screwdriver tip or like tool, provides the means for prying the lips out from beneath the shoulders to release the cover from the socket. U.S. Pat. No. 4,504,105 describes a release mechanism for the above described cover which obviates the need for a tool. This release mechanism includes a plate with arms having side flaps which engage the tabs on the latches. By pressing down on the plate which extends over the cover, the side flaps are pivoted outwardly to withdraw the lips from beneath the shoulders. The release mechanism is a separate component which can be attached and removed from the described cover.

The present invention is intended to provide a one piece cover similar to the above kind and which incorporates, as an integral part thereof, release members.

A cover as defined in the first paragraph of this specification is, according to the present invention therefor, characterized in that one end is pivotally mounted on one side of a socket and the other end includes a pair of depending sections extending downwardly on each of two opposing sides of the socket with inwardly projecting lips on the free ends and further an elongated arm attached to each depending member at right angles thereto to extend across one side of the socket towards each other. The arms are depressible to force the lips out from the socket.

The state of the art is further exemplified by U.S. Pat. Nos. 4,460,223, 4,144,648, 3,831,131 and 3,391,383.

For a better understanding of the invention reference will now be made by way of example to the accompanying drawings, in which:

FIG. 4 is a view similar to FIG. 2 of the cover on the socket showing the method of releasing the cover; and FIG. 5 is a front view further illustrating the releasing action of FIG. 4.

Figure 1:
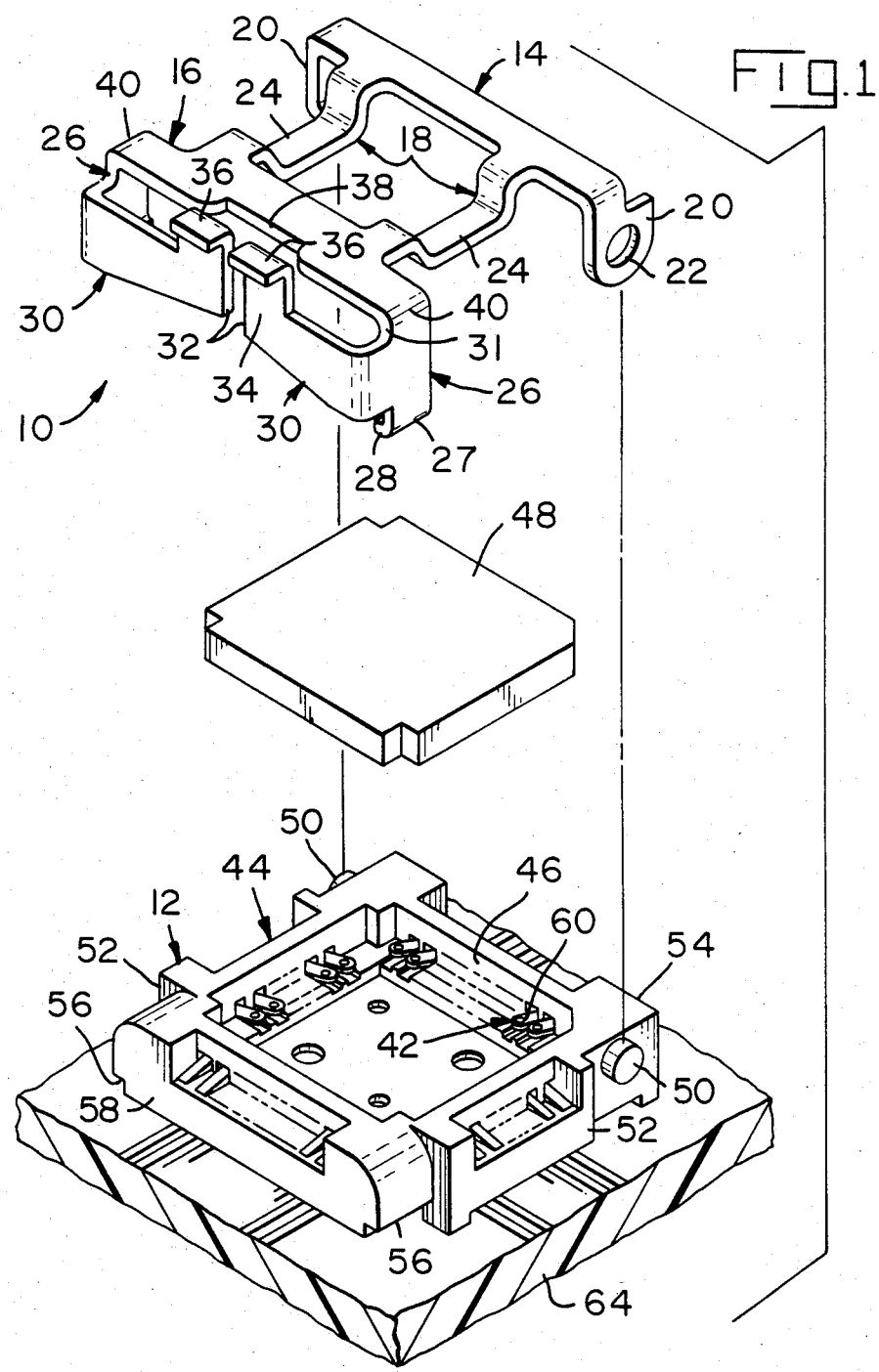
FIG. 1 is a perspective exploded view showing a socket, chip carried and the cover of the present invention.

Cover 10 is shown exploded from socket 12 in FIG. 1. Cover 10 includes rear rail 14 and front rail 16, the two being joined together by parallel side rails 18.

Depending ears 20 are provided at each end of rear rail 14 and having a hole 22 extending therethrough, the axis of holes 22 being parallel to the axis of rear rail 14.

Side rails 18 are formed with a downwardly displaced portion 24 intermediate front and rear rails 16, 14.

The two longitudinal ends of front rail 16 are bent down to form depending sections 26. The free end 27 of each section 26 is bent inwardly to form lip 28.

An elongated arm 30 extends from a front edge 31 of each depending section 26. Note that the arm at the front edge 31 is almost as wide as section 26 is long and although the arm's width thins towards free ends 32, the thinning is not substantial. Arms 30 are bent to be positioned in front of and parallel to front rail 16. The arms 30 extend towards each other with free ends 32 on each arm 30 meeting (with a small space therebetween) at the center of front rail 16.

A segment 34 extends upwardly from each arm 30 at free end 32. The upper end of the segment 34 is bent away from front rail 16 to form tab 36. The two tabs 36 are located in front of notch 38 in front rail 16.

Arms 30 are levers which, when a downwardly directed force is applied to the free ends 32, cause free ends 27 on depending sections 26 to swing laterally (parallel to the axis of front rail 16) outwardly with the hinge point being indicated by reference numeral 40, the point where depending sections 26 are attached to front rail 16. Arms 30, in cooperation with depending sections 26, constitute a release means which is integral with the other structural members of cover 10.

Socket 12 is a leadless chip carrier socket which consists of a number of conductive contact elements 42 in insulative housing 44. An upwardly open cavity 46 is provided in housing 44 to receive a conventional leadless chip carrier 48.

Short lugs 50 are provided on each opposing side walls 52 of socket 12 and are near rear wall 54. The lugs are circular and sized such that they are readily received into holes 22 on ears 20 of cover 10.

Downwardly facing shoulders 56 are provided on opposing side walls 52 near or immediately adjacent front wall 58 of socket 12.

Contact elements 42 include an upper contact surface 60 which engages conductive pads (not shown) on the underside of carrier 48 and depending leads 62 (FIGS. 3 and 5) which are for attachment to circuit board 64 in anyone of several conventional methods.

Figure 2:
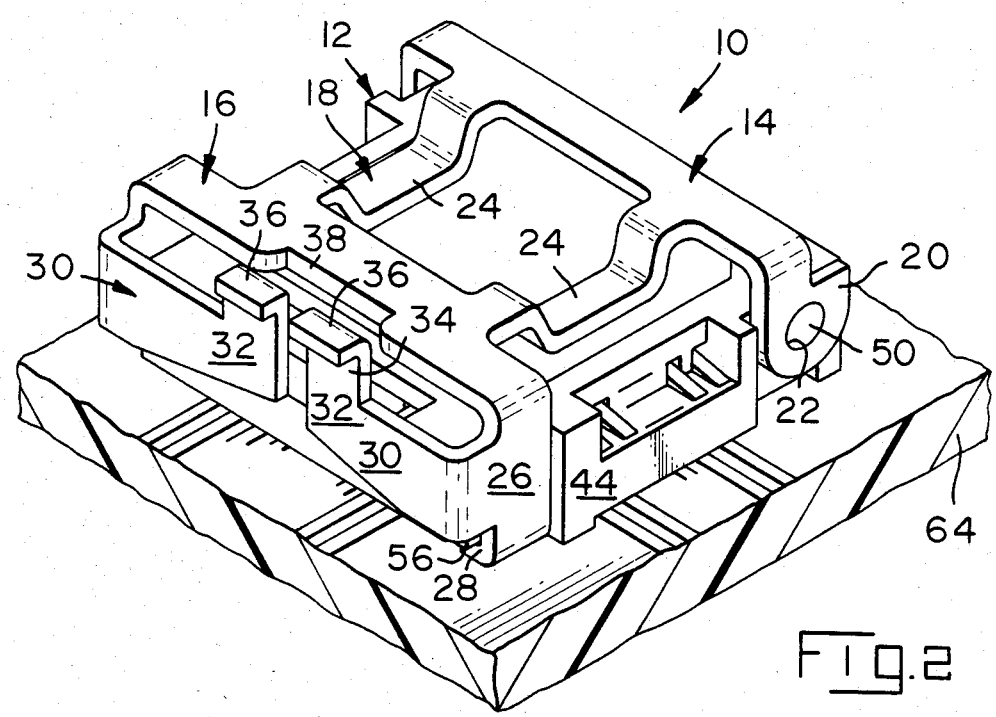
FIG. 2 is a perspective view of the cover of FIG. 1 assembled onto a socket.
Figure 3:
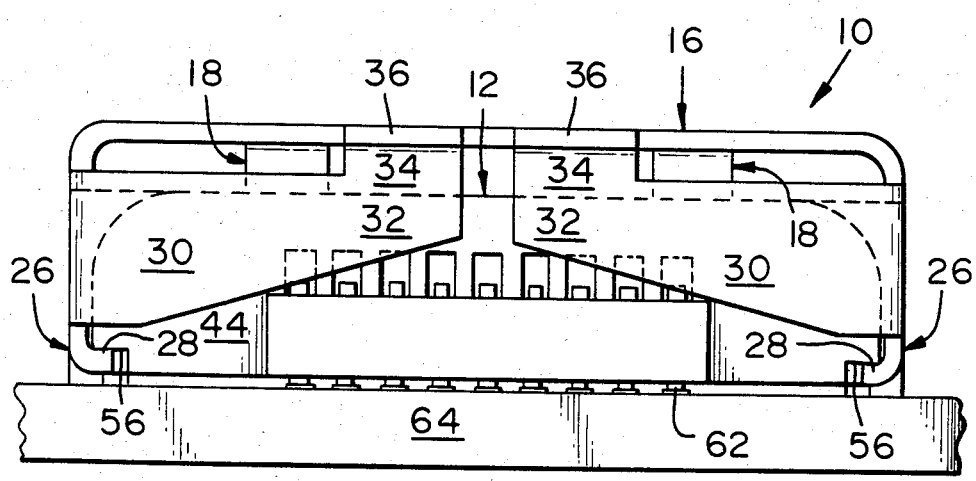
FIG. 3 is a front view of the socket and cover showing the cover in a closed position and its latching to the socket.

FIGS. 2 and 3 show cover 10 attached to socket 12 and in a closed position. The cover 10 is pivotally mounted on socket 12 by lugs 50 being received in holes 22 in ears 20 depending from rear rail 14. In the closed position, cover 10 is latched to socket 12 by reason of inwardly projecting lips 28 on sections 26 catching in under downwardly facing shoulders 56 on housing 44. With the cover 10 in the closed position, downwardly displaced portions 24 of side rails 18 bear against chip carrier 48 which may be positioned in cavity 46 in housing 44 to press it against contact surfaces 60 on contact elements 42.

FIGS. 4 and 5 illustrate the functioning of the intergral release mechanism on cover 10. When a force is applied against tabs 36 in the direction indicated by arrow 66 in FIG. 4, free ends 32 move down towards circuit board 64. Since arms 30 cannot by themselves pivot by reason of their broad attachment to depending sections 26, pivoting must take place elsewhere which in this case is at hinge points 40. With free ends 32 being pushed down, free ends 27 on sections 26 swing laterally out from the socket, as indicated by arrows 68, pulling lips 28 from under shoulders 56. Cover 10 is now free to pivot up and rearwardly on lugs 50 to provide access to cavity 46.

Cover 10 is preferably made from 1050 steel, annealed and finished with a tin-lead plating.

I claim

1. A cover for chip carrier sockets having downwardly facing shoulders on two opposing side walls, said cover comprising:

a. spaced apart front and rear rails connected by parallel and spaced apart side rails extending therebetween;
b. means on the rear rail for pivotally mounting the cover on the socket for movement between an open position and a closed position;
c. said front rail having the ends thereon bent downwardly to form depending sections and with the free ends of the depending sections bent inwardly to form lips, said lips being received under the downwardly facing shoulders when the cover is in a closed position on the socket; and
d. release means integral with the depending sections for withdrawing the lips from beneath the downwardly facing shoulders, said release means including lever arms attached to each depending section and bent at right angles thereto so that with a downward force applied to the lever arms, the lips on the depending sections swing away from the downwardly facing shoulders on the socket on which the cover may be mounted.

2. The cover of claim 1 wherein the lever arms extend parallel to and along the front rail with free ends of the lever arms facing each other.

3. The cover of claim 1 further including tabs on the free ends of the lever arms, said tabs being bent at right angles to the arms to project away therefrom.

4. A cover member for a chip carrier socket to maintain a chip carrier therein and to be released therefrom, comprising:
   front and rear rail members interconnected with spaced apart side rail members;
   means provided by said rear rail members for pivotally connecting the cover member onto the chip carrier socket;
   means provided by said cover member for engaging the chip carrier to maintain the chip carrier in position in the socket when the cover member is in a closed position;
   latching means attached to said front rail member and having sections thereon extending downwardly along the sides of said chip carrier socket for latchably engaging latching members on the socket to maintain the cover member in the closed position; and
   release means attached to said sections and extending parallel to said front rail member therefrom and having outwardly-bent free ends against which a force may be applied to unlatch said latching means from the latching members by translating said force to said sections causing said latch means to become unlatched from the latching members.

5. A cover member as claimed in claim 4, wherein said engaging means comprise downwardly-directed sections on said side rail members.

6. A cover member as claimed in 4, wherein said sections on said latching means comprise downwardly-directed extensions of said front rail member having inwardly-directed free ends.

7. A cover member as claimed in claim 6, wherein said release means comprise arm members extending outwardly from front edges of said extensions and extending parallel to said front rail member.

8. A cover member as claimed in claim 7, wherein free ends of said arm members include segments extending substantially parallel to said extensions and having thereon said outwardly-bent free ends.

9. A cover member for a socket to releasably maintain an electronic package therein, comprising:
   a frame defined by rail members;
   means provided on one rail member for pivotally connecting said frame to said socket to permit said frame to move between an open and closed position on said socket;
   means provided by said frame for engaging and maintaining said electronic package in said socket when said frame is in a closed position;
   latching means as part of another rail member and having pivotal, depending sections for latchably engaging latching members on said socket to maintain said frame in a closed position; and
   release means comprising elongated arm members attached to and extending from said depending sections at right angles thereto, said arm members having outwardly-bent free ends against which a force may be applied causing said depending sections to pivot and become unlatched from said latching members.

* * * * *